United States Patent
Vinet et al.

(10) Patent No.: US 7,713,850 B2
(45) Date of Patent: May 11, 2010

(54) METHOD FOR FORMING A STRUCTURE PROVIDED WITH AT LEAST ONE ZONE OF ONE OR SEVERAL SEMICONDUCTOR NANOCRYSTALS LOCALISED WITH PRECISION

(75) Inventors: Maud Vinet, Rives (FR); Jean-Charles Barbe, Grenoble (FR); Pierre Mur, Crolles (FR); François De Crecy, Seyssins (FR)

(73) Assignee: Commissariat A l'Energie Atomique, Paris (FR)

( * ) Notice: Subject to any disclaimer, the term of this patent is extended or adjusted under 35 U.S.C. 154(b) by 434 days.

(21) Appl. No.: 11/183,993

(22) Filed: Jul. 19, 2005

(65) Prior Publication Data

US 2006/0019459 A1    Jan. 26, 2006

(30) Foreign Application Priority Data

Jul. 20, 2004    (FR)    ................... 04 51589

(51) Int. Cl.
*H01L 21/20* (2006.01)

(52) U.S. Cl. .............. 438/487; 438/107; 438/167; 438/962; 438/459; 257/E29.241; 257/E29.267; 257/E21.054; 257/E21.403

(58) Field of Classification Search .......... 438/487, 438/107, 166, 167, 172, 455, 459, 482, 486, 438/962; 977/773, 784; 257/E29.241, E29.267, 257/E21.054, E21.403
See application file for complete search history.

(56) References Cited

U.S. PATENT DOCUMENTS

| 5,028,780 | A | * | 7/1991 | Kaito et al. | ................. | 250/307 |
| 5,879,447 | A | * | 3/1999 | Okada et al. | ................. | 117/8 |
| 6,309,798 | B1 | | 10/2001 | Reetz et al. | | |
| 2002/0086483 | A1 | | 7/2002 | Kim et al. | | |
| 2003/0071312 | A1 | * | 4/2003 | Oana et al. | ................. | 257/368 |
| 2003/0160239 | A1 | * | 8/2003 | Shinagawa et al. | ........... | 257/64 |
| 2004/0072393 | A1 | * | 4/2004 | Yamazaki et al. | .......... | 438/149 |

FOREIGN PATENT DOCUMENTS

| EP | 0 969 126 A2 | 1/2000 |
| EP | 1 229 590 A1 | 8/2002 |

OTHER PUBLICATIONS

Definition of excimer laser on www.rp-photonics.com/excimer_lasers.html.*

(Continued)

*Primary Examiner*—Hsien-ming Lee
*Assistant Examiner*—Su C Kim
(74) *Attorney, Agent, or Firm*—Oblon, Spivak, McClelland, Maier & Neustadt, L.L.P.

(57) ABSTRACT

Method for forming a structure provided with at least one zone of one or several semiconductor nanocrystals (13). It consists in:

exposing with a beam of electrons (11) at least one zone (12) of a semiconductor film (1) lying on an electrically insulating support (2), the exposed zone (12) contributing to defining at least one dewetting zone (10) of the film (1), annealing the film (1) at high temperature in such a way that the dewetting zone (10) retracts giving the zone of one or several nanocrystals (13).

18 Claims, 3 Drawing Sheets

OTHER PUBLICATIONS

F. Mazen, et al., "Preferential nucleation of silicon nano-crystals on electron beam exposed $SiO_2$ surfaces", Microelectronic Engineering, Elsevier Publishers BV., vol. 73-74, XP-004564675, Jun. 2004, pp. 632-638.

T. Baron, et al., "Silicon quantum dot nucleation on $Si_3N_4$, $SiO_2$ and $SiO_xN_y$ substrates for nanoelectronic devices", Journal of Crystal Growth, vol. 209, No. 4, XP-004198429, Feb. 2000, pp. 1004-1008.

Anri Nakajima et al., "Si Quantum Dot Formation with Low-Pressure Chemical Vapor Deposition", Jpn J. Appl.Phys., vol. 35, No. 2B, XP-002323294, Feb. 15, 1996, pp. L189-L191.

U.S. Appl. No. 12/520,385, filed Jun. 19, 2009, Barbe et al.

* cited by examiner

METHOD FOR FORMING A STRUCTURE PROVIDED WITH AT LEAST ONE ZONE OF ONE OR SEVERAL SEMICONDUCTOR NANOCRYSTALS LOCALISED WITH PRECISION

TECHNICAL FIELD

The present invention concerns a method for forming a structure with at least one zone of one or several semiconductor nanocrystals localised with precision on a support.

Said zones of nanocrystals are elements entering into the composition of electronic devices such as Flash memories, non-volatile memories or single electron transistors. Said zones form islands in which electrons are confined.

Said zones of nanocrystals may also be profitably employed for using the optical properties of the nanocrystals.

Said nanocrystals are preferentially in silicon, in germanium or in silicon germanium alloy in the first applications cited in order to assure compatibility with existing CMOS technology. Moreover, to fulfil their function at room temperature, said zones must have maximum dimensions of several nanometres, typically 5 nanometres.

STATE OF THE PRIOR ART

There are several families of methods currently used to obtain zones of semiconductor nanocrystals.

The first family uses vapour phase chemical deposition methods, which make it possible to obtain zones of nanocrystals of required size as described in the document [1], the references of which are given at the end of the description.

The deposited layers may be obtained by traditional vapour phase deposition techniques: CVD (chemical vapour deposition), PECVD (plasma enhanced chemical vapour deposition), LPCVD (low pressure chemical vapour deposition), RP-CVD (reduced pressure chemical vapour deposition) and co-sputtering.

Another family of methods is known as growth methods. Said methods are based on the growth of crystals from a gas phase using CVD type techniques. One may refer to the document [2], the references of which are given at the end of the description. The control of the growth rate makes it possible to control the mode of growth to two dimensions or three dimensions. Gas phase chemical depositions in an industrial reactor now make it possible to control the density of the nanocrystals (typically between $10^9/cm^2$ and $1.5.10^{12}/cm$ for silicon) and their diameter (typically between 3 nm and 30 nm).

Recent work has shown that it is possible to control in an independent manner the density and the diameter of the nanocrystals by using a specific substrate with nucleation seeds that form preferential growth sites for the nanocrystals.

The document [3], the references of which are given at the end of the description, discloses that by carrying out a superficial treatment of the layer (in silicon oxide) on which the nanocrystals are going to grow through electronic irradiation, one may form these sites by locally desorbing oxygen.

These methods, which do not use germination sites, do not enable the crystallographic orientation of the nanocrystals formed to be controlled. All of these methods only allow with great difficulty the installation of control electrodes in the same way as that mentioned here-above.

Another family known as through precipitation, is based on the preparation of a layer or matrix, the composition of which, based on silicon, is known as sub-stoichiometric. Such a layer may be of $SiO_x$ where x is strictly less than 2. The stoichiometric form of disilicon oxide is obtained when x equals 2.

During the deposition, the stoichiometry is adjusted as a function of the relative concentrations of the gaseous species brought into play.

These layers may also be obtained by ion implantation. One implants silicon in a layer of amorphous silica $SiO_2$ in such a way as to enrich it locally. It is directly the quantity implanted that makes it possible to control the stoichiometric difference.

The layers are then annealed at high temperature (typically between 600° C. and 1250° C.) and silicon nanocrystals form, they are surrounded by stoichiometric silicon. An independent control of the density of the nanocrystals and their radius may be achieved.

The layer of sub-stoichiometric composition may also be obtained by high energy electronic bombardment (several keV) of a base layer in amorphous silica $SiO_2$ or in silicon nitride $Si_3N_4$. The irradiation makes it possible to create crystals of silicon within a matrix of silicon oxide or nitride. One may refer to the document [4], the references of which are given at the end of the description.

These methods have numerous disadvantages. Methods other than electronic irradiation do not make it possible to control the position of the nanocrystals since they form at the level of faults such as an aggregate of silicon atoms or an impurity for example, in the base layer. The distribution and the localisation of these sites, known as nucleation sites, are for the most part random cases. When one wishes to use these nanocrystals to form single electron transistors, it is necessary to place on either side of said zones of nanocrystals control electrodes that are preferentially localised in the plane in which said nanocrystals are formed. The electrodes can only be put in place with great difficulty. It requires a very astute control of the self-alignment during the technological steps making it possible to construct said control electrodes.

None of these methods allow the control of the crystallographic orientation of the nanocrystals formed. This orientation is a priori random and has no reason to be correlated from one nanocrystal to its neighbour(s).

In all cases the nanocrystals are created within an insulating matrix of amorphous silica or of silicon nitride, said insulating matrix not necessarily having any functional significance.

The final family of methods is of the etching type.

One may use resins, the properties of which have been modified by irradiation under an electron beam. The exposed resin is developed, which makes it possible to create geometric patterns of nanometric size in the resin, and thereby in the underlying layer after etching by relying on the resin used as a mask. The resin is then removed. The underlying layer may be in silicon, in germanium or in silicon germanium alloy.

One may carry out a direct exposure by electron beam of a film obtained by liquid phase deposition assisted by a rotation of the wafer (known as spin-coating) from a solution containing a metal or a transition metal from groups 4 to 12 of the Periodic Table as described in the document [5], the references of which are given at the end of the description.

One may also carry out a direct etching of a pattern in a precursor film (aluminium) and an ionic bombardment of the etched precursor film as described in document [6], the references of which are given at the end of the description.

Said etching methods partially offset the disadvantages of the aforementioned methods since they make it possible to define and to localise the zones of nanocrystals. Nevertheless, as regards the first two methods, they require the laying down of a resin or of a precursor, its exposure and its development.

Therefore, they are quite expensive and pose problems of organic contamination. As for the technique of etching by ionic bombardment, it requires the use of a focused ion beam, which is not a standard tool in production.

It is also possible to use the techniques of local probe associated with an atomic force microscope or a tunnel effect microscope to localise, position and pick up electrical contacts on the nanocrystals. This method is a method of displacing localised objects that requires the intervention of an operator to position the nanocrystals(s) at the desired locations. Said method cannot be integrated in an industrial procedure such as that of CMOS technology.

DESCRIPTION OF THE INVENTION

The present invention has precisely the aim of proposing a method for forming a structure provided with at least one zone of one or several semiconductor nanocrystals that does not have the abovementioned disadvantages.

One aim in particular is to localise with great precision the zone of nanocrystals within the structure while controlling the crystallographic orientation of the nanocrystals formed.

A further aim of the invention is to form the structure at low cost.

A further aim of the invention, in the case where the structure comprises at least one electrode next to the zone of nanocrystals and in the plane of said zone of nanocrystals, is to easily form said electrode.

A further aim of the invention is to propose a method compatible with integration in an industrial procedure such as that of CMOS technology.

Yet a further aim of the invention is to do away with any organic pollution linked to the resins or other precursors.

To achieve these aims, the invention proposes exploiting the phenomenon of dewetting of a semiconductor film at high temperature. Said phenomenon of dewetting, which consists in a localised retraction of the semiconductor film at high temperature to form droplets as do liquids, is a known phenomenon that appears during the technological sequence necessary for the manufacture of MOS type components. At present said retraction is considered as a disadvantage that needs to be combated during the manufacture of the components.

More precisely, the present invention concerns a method for forming a structure provided with at least one zone of one or several semiconductor nanocrystals. It consists in:
  exposing with a beam of electrons at least one zone of a semiconductor film lying on an electrically insulating support, the exposed zone contributing to defining at least one dewetting zone of the film,
  annealing the film at high temperature in such a way that the dewetting zone retracts giving the zone of one or several nanocrystals.

It is advantageous to dope at least the zone to be exposed of film before the exposure in order to modify the properties of transport by diffusion to the surface of the semiconductor film and/or in its volume and/or the wetting properties between the film and the support.

It may be advantageous to dope at least one zone surrounding the zone to be exposed in such as way as to take account of a lateral extension of the dewetting zone.

The annealing temperature may be typically between around 650° C. and 1250° C.

The semiconductor film and/or the electrically insulating support may be monolayers or multilayers.

To reduce the annealing temperature, the semiconductor film may be strained.

The semiconductor film may be formed from silicon and/or germanium.

The electrically insulating support may be formed in silicon oxide or in silicon nitride at least at the level of the interface with the semiconductor film.

It is possible to carry out simultaneously the exposure step and the annealing step.

The annealing step may take place within an electronic microscope.

The annealing step may take place under a neutral or reducing atmosphere.

The exposure zone may comprise one or several parts, when there are several, they may be side by side or separated from each other.

Said parts may be point shaped.

The electron beam may be scanning to achieve the exposure.

The film may be full wafer or, quite the opposite, delimited into at least one pattern.

The patterned film may form, at the end of the annealing step, in addition to the zone of nanocrystals, at least one electrode intended to cooperate with the zone of nanocrystals.

The electrode and the zone of nanocrystals are separated by a zone of the support forming a tunnel junction.

The structure may correspond to a source, a channel and a drain of a single electron transistor.

BRIEF DESCRIPTION OF DRAWINGS

The present invention will be more fully understood on reading the description of embodiments given purely by way of indication and in nowise limitative, and by referring to the appended drawings in which.

It should be understood that the different possibilities described in the description that follows are not mutually exclusive.

Identical, similar or equivalent parts of the different figures described hereafter bear the same numerical references in such as way as to make it easier to go from one figure to another.

In order to make the figures easier to read, the different parts represented in the figures are not necessarily to the same scale.

DETAILED DESCRIPTION OF SPECIFIC EMBODIMENTS

Figure 1A:
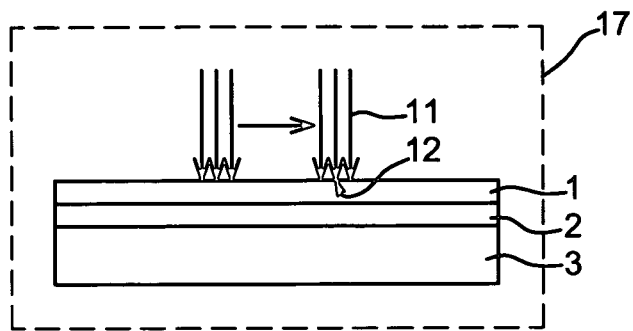
FIGS. 1A to 1C represent steps of a first example of the method according to the invention.
Figure 1B:
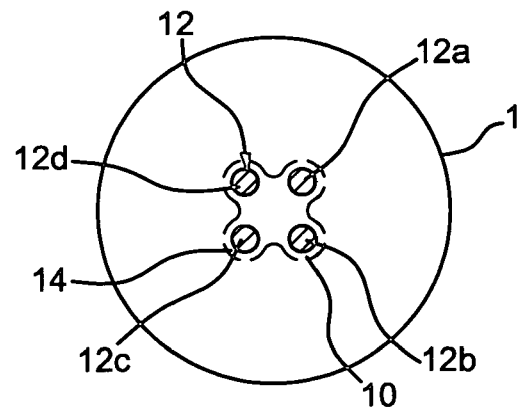
Figure 1C:
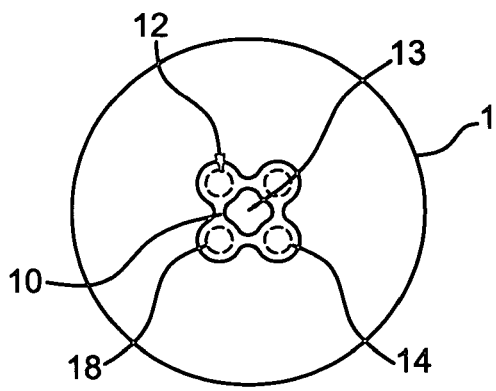

We will now describe the steps for forming a structure provided with at least one zone of one or several semiconductor nanocrystals according to the invention. Reference is made to FIGS. 1A, 1B, 1C.

One begins with a thin film 1 in semiconductor material that is lying on a support 2 in electrically insulating material (FIG. 1A).

The reference 3, in the example described, represents a semiconductor substrate on insulator, for example SOI (Silicon On Insulator). In this case, the semiconductor film 1 is formed of the thinnest semiconductor layer of the SOI substrate and the support 2 is the insulating layer placed between the two semiconductor layers of the SOI substrate.

The semiconductor film 1 may be monolayer. It may for example be a film of silicon or germanium or silicon-germanium.

As a variant, the semiconductor film may be multilayer. It may for example be a stacking of germanium on silicon, silicon-germanium on silicon or any other compatible stacking of these materials. In FIG. 1A, a monolayer film is illustrated and in FIG. 2A a multilayer film is illustrated.

Figure 2A:
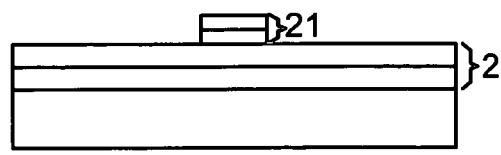
FIGS. 2A to 2D represent steps of a second example of the method according to the invention, FIG. 2E schematically represents a SET type transistor obtained by the method of the invention.

The dielectric support 2 may be in silicon oxide or in silicon nitride for example at least at the level of the interface with the semiconductor film 1. The support 2 may also be monolayer (FIG. 1A) or multilayer (FIG. 2A). When it is multilayer, it may be for example formed of a stacking of layers of silicon oxide and silicon nitride.

The film 1 is exposed on at least one zone 12 by a beam of electrons 11. Said exposure makes it possible to control a place from where a phenomenon of dewetting of the film 1 is going to be able to occur. The purpose of the exposure is to initiate an agglomeration of the film 1, said agglomeration being completed during an annealing step described below. The interface between the thin film 1 and support 2 is going to be modified by the electron matter interaction. The exposure zone 12 is going to condition the definition of the dewetting zone 10 of the film 1. Said dewetting zone 10 may extend beyond the exposure zone 12. Said dewetting zone 10, in retracting, is going to lead to the rupture of the film 1 and thereby give the zone of one or several nanocrystals 13.

Said dewetting zone 10 has a lateral extension 14 compared to the exposure zone 12. In FIG. 1B, the lateral extension 14 is illustrated. Said lateral extension may be minimised for example by a prior implantation of doping species as will be seen later. This locally reduces the diffusion.

The exposure is carried out using means 17 capable of producing the electron beam 11 such as an electronic microscope, scanning or not, or any other instrument producing a beam of electrons 11. Said means are shown schematically in FIG. 1A. The exposure zone 12 may extend over one or several parts 12a, 12b, 12c, 12d. Said parts may be point shaped as in FIG. 1C, in other words correspond to the section of the electron beam 11. When there are several parts, they may be side by side or well separated from each other. The electron beam 11 may have a diameter of several nanometres (typically 3 nanometres) and, to expose a larger surface than that of the electronic beam, it may be necessary to scan the film 1 with the electron beam 11 as in FIG. 1A. The electron beam 11 may cover a determined and not necessarily continuous path to define one or several dewetting zones 10.

The semiconductor film 1 on its support 2 is subjected to an annealing at high temperature typically between around 650° C. and 1250° C. During this step, the major part of the dewetting is produced. The film 1 of the dewetting zone 10 retracts and agglomerates forming the zone of one or several nanocrystals 13. This zone of nanocrystals 13 is often called quantum dot in the literature.

The annealing in fact activates the surface diffusion, in other words activates the mobility of the atoms in the dewetting zone 10. Said mobility has been authorised by the embrittlement of the interface between the film 1 and the support 2 generated by the exposure.

The size of the section of the electron beam 11 directly influences the minimum size of the zone of nanocrystals 13. The thinner the electron beam 11, the smaller the zone of nanocrystals 13. On the other hand, in the case where the exposure zone 12 is extensive, the size of the section of the electron beam 11 does not influence that of the zone of nanocrystals 13 since the electron beam is scanning.

The electron beam 11 will have an energy of around 500 eV for a film of around 10 nanometres thickness. This energy may be optimised as a function of the thickness of the film. Indeed, the depth of penetration of the electrons in the material of the film 1 is proportional to $E^x$, where E is the energy of the incident electrons and x close to 1.6. The thicker the film 1, the higher the energy required to reach the interface between the film 1 and the support 2.

The problem of the precise positioning of the nanocrystals of the zone of nanocrystals is spatially resolved with the positioning precision of the exposure zone 12 and thereby the precision of the means capable of producing the electron beam 11. The crystallographic orientation of the crystals is controlled during the agglomeration, it correspond to the crystallographic orientation of the initial film 1.

The annealing step may be carried out preferentially under a neutral or even reducing atmosphere to limit the growth of an oxide at the surface of the thin film. Such an oxide could in effect totally cancel any diffusion of material to the surface of the film. The neutral atmosphere may be nitrogenated. The reducing atmosphere may be hydrogenated or chlorinated for example.

The exposure step and the annealing step may be carried out simultaneously and take place for example in situ in a scanning electronic microscope.

It is advantageous to provide for, before the exposure step, a preliminary step of doping by implantation of doping species in the film 1 of at least the exposure zone 12 and/or at least one zone 18 surrounding the exposure zone 12. The zone 18 surrounding the exposure zone may not come into contact with the exposure zone 12. The doping species may be boron, phosphorous, arsenic, boron fluoride $BF_2$ for example. Said doping allows a better control of the extension 14 of the dewetting zone 10 compared to the exposure zone 12. Said doping modifies the diffusion and/or wetting properties between the film 1 and the support 2. This step makes it possible to control the rate of dewetting and thereby the lateral extension 14 of the dewetting zone 10 for a given annealing time.

The annealing step lasts several minutes (typically two minutes) but as a function of the thickness of the film 1, the doping, the temperature and the desired extension 14, the time may be adapted.

An advantageous variant is to use a strained thin film, in other words a film in which the mesh parameter differs to that of the same film free of any external strain. It may be strained silicon, germanium or silicon germanium.

In this case, the loss of cohesion of the interface during the exposure is going to lead to a gradient of elastic energy that is going to directly influence the rate of dewetting of the film 1 since this gradient term is a driving term in the flow of matter. Typically, the characteristic migration time of atoms by diffusion to the surface of the strained film 1 is inversely proportional to $\xi^8$, where $\xi$ represents the elastic energy of the film. The rate of dewetting is going to be extremely sensitive to the strain condition of the film and said strain condition of the film thereby appears as a parameter that makes it possible to control the kinetic and to have a certain liberty with regard to the annealing temperature. The more the film is strained, the more it is possible to work at low temperature for a given kinetic.

In FIGS. 1A to 1C, the film 1 is a full wafer film, which signifies that it completely covers the support 2. As a variant, said film 21 may be delimited into at least one pattern. Its surface area is smaller than that of the support 2, said support 2 is apparent as illustrated in FIGS. 2A, 2B.

Referring to FIGS. 2A to 2D, we will now describe a new example of a method for forming a structure provided with at least one zone of one or several nanocrystals according to the invention. Said structure is a part of a single electron transistor (SET).

Such a transistor comprises a zone of one or several nanocrystals, which is a controlled electron storage site (channel). Access to this zone of nanocrystals is achieved by two electrodes (drain, source) that extend in the plane of the zone of nanocrystals. Between the zone of nanocrystals and each of the electrodes is a tunnel junction. In FIG. 2D only the source, the drain and the channel of the single electron transistor are shown. In FIG. 2E, a gate electrode 20 has been added.

Figure 2B:
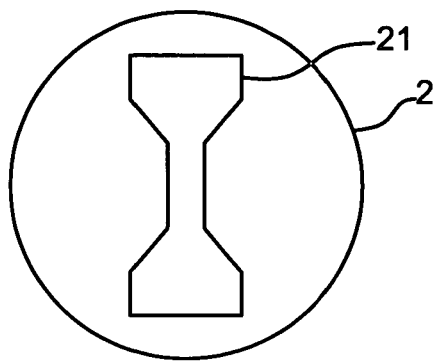
Figure 2C:
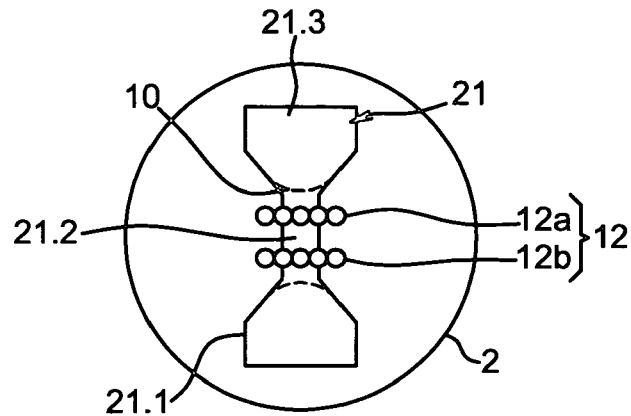
Figure 2D:
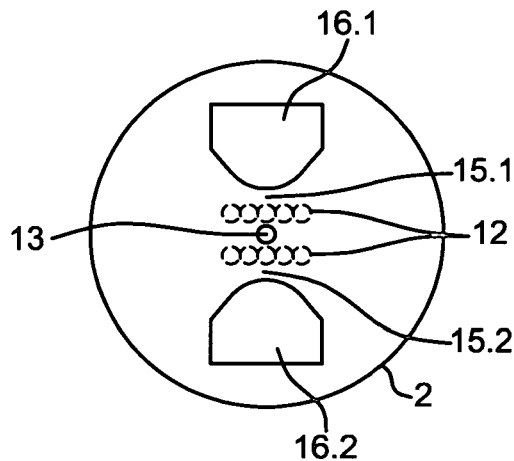
Figure 2E:
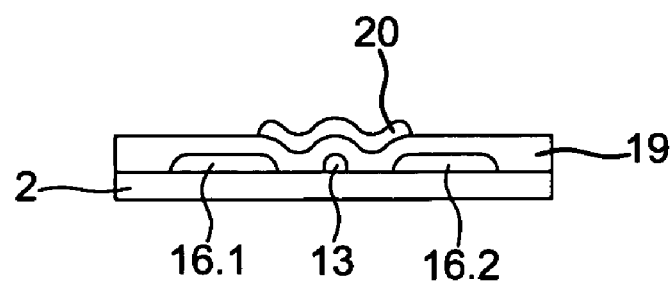

In the configuration of FIGS. 2A-2C, it is possible to dope the patterned film 21 in its totality. In FIG. 2C, the dewetting zone 10 is delimited with dotted lines and the exposure zone 12 is illustrated. The exposure zone 12 is in two parts 12a, 12b, said two parts are not point shaped, they are elongated and cross through the film 21 while dividing it into three successive segments 21.1 to 21.3, one median 21.2 and the two other end segments 21.1, 21.3. The exposure zone 12 does not necessarily have to extend beyond the patterned film 21 but this can make it possible to offset any lack of precision in positioning during the exposure.

After the annealing step (FIG. 2D), the median segment 21.2 of the film 21 has retracted, it forms the zone of one or several nanocrystals 13. The two end segments 21.1, 21.3 have only retracted locally from the median segment 21.2. They form the control electrodes 16.1, 16.2 (drain, source). Between the zone of nanocrystals 13 and each of the two electrodes 16.1, 16.2, the dielectric material present from the support 2 is going to form the tunnel junctions 15.1, 15.2.

Reference is now made to FIG. 2E. To form the single electron transistor, the structure then needs to be encapsulated in a dielectric material 19 (for example thermal silicon oxide or hafnium oxide) and to provide the structure with a gate 20 obtained for example by a sequence known to those skilled in the art as deposition/photolithography/etching of polysilicon or any other known stacking to form a gate (for example TiN/Tungsten, etc.). Provision also has to be made for contact pick ups on the active elements of said single electron transistor. These are not represented in FIG. 2E.

Since the two electrodes 16.1, 16.2 have been formed at the same time as the zone of nanocrystals 13, they are self-aligned with it.

By proceeding in this manner, it is possible to control the spot from which the dewetting is going to be initiated and the amplitude of the lateral extension over which the dewetting is going to extend. The phenomenon of dewetting that posed a problem in the past is here put to good use to control the position of the nanocrystals.

Figure 3:
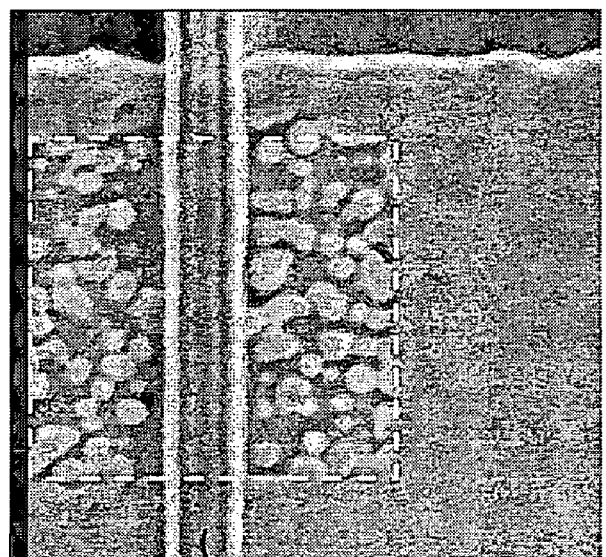
FIG. 3 represents a photograph of a zone of nanocrystals obtained with the method according to the invention.

FIG. 3 illustrates a photograph of the zone of nanocrystals obtained by the method according to the invention. The film in silicon lies on a support in silicon oxide of a SOI substrate. It has a thickness of 10 nanometres. It has been doped with boron fluoride $BF_2$ ($5.10^{14}$ at/cm$^2$ with an energy de 3 keV). It has been irradiated with a beam of electrons of 0.5 KeV in the dotted line area. The silicon clusters, in other words the zone of nanocrystals, have been obtained after annealing at 650° C. for 2 minutes. The size of the nanocrystals formed is around 25 nanometres and their density around $10^9$/cm$^2$.

A gate 20 has been deposited through the zone of nanocrystals after the dewetting.

The method thus described is fully compatible with the present CMOS procedure. It is not necessary to dispose of specific focused ion beam devices for example.

There is no risk of organic pollution linked to resins or other precursors.

Although several embodiments of the present invention have been represented and described in a detailed manner, it will be understood that various changes and modifications may be made without going beyond the scope of the invention.

DOCUMENTS CITED

[1] Silicon quantum dot nucleation on $Si_3N_4$ and $SiO_xN_y$ substrates for nanoeletronic devices, T. Baron, F. Martin, P. Mur, C. Wyon, M. Dupuy, Journal of Crystal Growth 209 (2000) pages 1004-1008.

[2] Si quantum dot formation with low-pressure chemical vapor deposition, A. Nakajimi, Y. Sugita, K. Kawamura, H. Tomita, N. Yokoyama, Japan Journal of Applied Physics, Vol. 35 (1996) pages 189 to 191.

[3] Preferential nucleation of silicon nano-crystals on electron-beam exposed $SiO_2$ surfaces, F. Mazen, L. Mollard, T. Baron, S. Decossas, J. M. Hartmann, Microelectronics Engineering 73-74 (2004), pages 632-638.

[4] EP-A-0 969 126.

[5] U.S. Pat. No. 6,309,798.

[6] US-A-2002/0086483.

The invention claimed is:

1. A method for forming a structure provided with at least one zone of one or more semiconductor nanocrystals, comprising:
    exposing, with a beam of electrons, at least one zone of a semiconductor film lying on an electrically insulating support, the exposed zone contributing to defining at least one dewetting zone of the semiconductor film and;
    annealing the semiconductor film at an annealing temperature to retract the dewetting zone giving the dewetting zone one or more nanocrystals,
    wherein the annealing is distinct from the exposing.

2. The method according to claim 1, further comprising doping the at least one zone of the semiconductor film before the exposing.

3. The method according to claim 1, further comprising doping the at least one zone of the semiconductor film surrounding the at least one zone of the semiconductor film to be exposed.

4. The method according to claim 1, wherein said annealing is done at the annealing temperature of between around 650° C. and 1250° C.

5. The method according to claim 1, wherein the semiconductor film and/or the electrically insulating support are a monolayer or multilayers.

6. The method according to claim 1, wherein the electrically insulating support is silicon oxide and/or silicon nitride located at least at an interface with the semiconductor film.

7. The method according to claim 1, wherein the semiconductor film is strained.

8. The method according to claim 1, wherein the semiconductor film is formed from silicon and/or germanium.

9. The method according to claim 1, wherein said annealing takes place within an electronic microscope.

10. The method according to claim 1, wherein said annealing takes place under atmospheric conditions where the atmosphere does not react with the semiconductor film or where the atmosphere is under a neutral or reducing atmosphere.

11. The method according to claim 1, wherein the exposed zone comprises one or multiple parts, when there are multiple parts, said parts are separated from each other or placed side by side.

12. The method according to claim 11, wherein said parts are point shaped.

13. The method according to claim 1, wherein the beam of electrons is scanning.

14. The method according to claim 1, wherein the semiconductor film is a full wafer.

15. The method according to claim 1, wherein the semiconductor film is delimited into at least one pattern.

16. The method according to claim 15, wherein the patterned semiconductor film forms, at the end of the annealing, in addition to the dewetting zone of nanocrystals, at least one electrode intended to cooperate with the dewetting zone of nanocrystals.

17. The method according to claim 16, wherein the at least one electrode and the dewetting zone of nanocrystals are separated by a zone of the electrically insulating support, forming a tunnel junction.

18. The method according to claim 16, wherein the structure corresponds to a source, a channel and a drain of a single electron transistor.

* * * * *